United States Patent
Chen et al.

(10) Patent No.: US 12,288,583 B2
(45) Date of Patent: Apr. 29, 2025

(54) MEMORY CONTROLLER AND METHOD FOR CALIBRATING DATA RECEPTION WINDOW

(71) Applicant: Realtek Semiconductor Corp., HsinChu (TW)

(72) Inventors: Shih-Chang Chen, HsinChu (TW); Chih-Wei Chang, HsinChu (TW); Chun-Chi Yu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 210 days.

(21) Appl. No.: 18/119,808

(22) Filed: Mar. 9, 2023

(65) Prior Publication Data

US 2023/0307038 A1   Sep. 28, 2023

(30) Foreign Application Priority Data

Mar. 24, 2022 (TW) .................................. 111110976

(51) Int. Cl.
*G11C 7/22* (2006.01)
*G11C 11/4072* (2006.01)
*G11C 11/4099* (2006.01)

(52) U.S. Cl.
CPC ...... *G11C 11/4099* (2013.01); *G11C 11/4072* (2013.01)

(58) Field of Classification Search
CPC .......................... G11C 11/4099; G11C 11/4072
See application file for complete search history.

(56) References Cited

U.S. PATENT DOCUMENTS

| | | | | |
|---|---|---|---|---|
| 11,482,262 B1 * | 10/2022 | Lee | ...................... | G11C 7/1048 |
| 11,960,739 B1 * | 4/2024 | Jeter | ...................... | G06F 3/0632 |
| 2021/0027817 A1 | 1/2021 | Chen | | |
| 2022/0093205 A1 * | 3/2022 | Lin | ...................... | G11C 29/1201 |
| 2022/0270664 A1 * | 8/2022 | Jeter | ...................... | G11C 29/021 |
| 2023/0032066 A1 * | 2/2023 | Lin | ...................... | G11C 29/022 |

FOREIGN PATENT DOCUMENTS

TW   I715446 B   1/2021

* cited by examiner

*Primary Examiner* — Min Huang
(74) *Attorney, Agent, or Firm* — Winston Hsu (57) ABSTRACT

A method for calibrating a data reception window includes: (A) setting a level of a reference voltage by different predetermined values and repeatedly sampling a data signal to obtain multiple first valid data reception windows; (B) establishing a first eye diagram based on the first valid data reception windows; (C) resetting the level of the reference voltage by the predetermined values combined with a first offset and repeatedly sampling the data signal according to the reference voltage to obtain multiple second valid data reception windows and (D) selectively updating the first eye diagram according to the second valid data reception windows. When width of a second valid data reception window is greater than width of a first valid data reception window corresponding to the same predetermined value, the first valid data reception window in the first eye diagram is replaced by the second valid data reception window.

18 Claims, 10 Drawing Sheets

MEMORY CONTROLLER AND METHOD FOR CALIBRATING DATA RECEPTION WINDOW

BACKGROUND OF THE INVENTION

1. Field of the Invention

The invention relates to a method for calibrating a data reception window and the memory controller utilizing the same.

2. Description of the Prior Art

During memory access operations (e.g., the interval of performing memory read and/or the interval of performing memory write), control signals (e.g., clock signal CLK, address signal ADDR and command CMD signal) may be sent from the memory controller (e.g., a central processing unit (CPU)) to the memory device, such as dynamic random access memory (DRAM). The clock signal CLK may be utilized as a system reference clock (for example, the data strobe signal DQS, the address signal ADDR and the command signal CMD should be aligned with the system reference clock). The command signal CMD may be configured with a first value to initiate a read operation and configured with a second value to initiate a write operation. The address signal ADDR indicates the address from which data is read during a read operation (for example, a selected memory address in the DRAM) and the address to which data is written during a write operation.

Generally, memory access operations are not synchronized with system control signals (such as clock signal CLK, address signal ADDR and command CMD signal), so the phase of the input/output data DQ received from the DRAM will not be aligned with any known clock signal in the memory controller. In view of this, in the memory access operation, it is necessary to provide the data strobe signal DQS together with the data DQ from the DRAM to the memory controller, so that proper timing relationship can be established between the data strobe signal DQS and the data DQ, for successfully receiving data DQ from DRAM.

In order to establish a proper timing relationship between the data strobe signal DQS and the data DQ, the data strobe signal DQS is delayed to sample the data DQ to construct a valid data reception window. Conventionally, the center of the rising edge or the falling edge of the clock pulse of the data strobe signal DQS is used to sample the data DQ. If it is unable to successfully sample the data DQ at the central point, the system will add one or more delays to the data strobe signal DQS for sampling the data DQ, until the data DQ is successfully sampled and received. The system will calculate the valid data reception window according to the successfully sampled data DQ with respect to the data strobe signal DQS with different delays.

However, as the data transmission rate increases, the voltage level of the data DQ received by the memory controller from the DRAM may have different voltage swings for different bits due to channel interference or other factors. This may significantly reduce the size or range of the valid data reception window.

To solve the above problems, a method and associated devices for calibrating the data reception window are needed to effectively increase the valid data reception window at the receiving end and strengthen the tolerance of the data reception window to voltage jitter.

SUMMARY OF THE INVENTION

It is an objective of the invention to provide a method for calibrating a data reception window and the associated devices to effectively enlarge the valid data reception window and strengthen the tolerance of the valid data reception window to voltage jitter, to solve the problem of the significant reduction in the size or range of the valid data reception window due to the increase of the data transmission rate.

According to an embodiment of the invention, a memory controller coupled to a memory device to control access operations of the memory device and receive a data signal from the memory device through a plurality of receiving pads comprises a sampling circuit configured to sample the data signal according to a reference voltage and a calibration circuit, configured to perform operations comprising: (A) setting a level of the reference voltage by using a plurality of predetermined values which are different values and controlling the sampling circuit to repeatedly sample the data signal according to the reference voltage to obtain a plurality of first valid data reception windows corresponding to the predetermined values, wherein one of the first valid data reception windows corresponds to one of the predetermined values; (B) establishing a first eye diagram based on the first valid data reception windows corresponding to the predetermined values; (C) resetting the level of the reference voltage by using the predetermined values combined with a first offset and controlling the sampling circuit to repeatedly sample the data signal according to the reference voltage to obtain a plurality of second valid data reception windows corresponding to the predetermined values, wherein one of the second valid data reception windows corresponds to one of the predetermined values; and (D) selectively updating the first eye diagram according to the second valid data reception windows corresponding to the predetermined values. When a width of one of the second valid data reception windows corresponding to one of the predetermined values is greater than a width of the first valid data reception window corresponding to said one of the predetermined values, the first valid data reception window corresponding to said one of the predetermined values in the first eye diagram is replaced by the second valid data reception window corresponding to said one of the predetermined values.

According to another embodiment of the invention, a method for calibrating data reception window comprises: (A) setting a level of a reference voltage by using a plurality of predetermined values which are different values and repeatedly sampling a data signal received from a memory device according to the reference voltage to obtain a plurality of first valid data reception windows corresponding to the predetermined values, wherein one of the first valid data reception windows corresponds to one of the predetermined values; (B) establishing a first eye diagram based on the first valid data reception windows corresponding to the predetermined values; (C) resetting the level of the reference voltage by using the predetermined values combined with a first offset and repeatedly sampling the data signal according to the reference voltage to obtain a plurality of second valid data reception windows corresponding to the predetermined values, wherein one of the second valid data reception windows corresponds to one of the predetermined values; and (D) selectively updating the first eye diagram according to the second valid data reception windows corresponding to the predetermined values. When a width of one of the second valid data reception windows corresponding to one of the predetermined values is greater than a width of the first valid data reception window corresponding to said one of the predetermined values, the first valid data reception window corresponding to said one of the predetermined values in the first eye diagram is replaced by the second valid data reception window corresponding to said one of the predetermined values.

According to yet another embodiment of the invention, a method for calibrating data reception window, comprising: (A) setting a level of a reference voltage by using a plurality of predetermined values which are different values and repeatedly sampling a data signal received from a memory device according to the reference voltage to obtain a plurality of first valid data reception windows corresponding to the predetermined values, wherein one of the first valid data reception windows corresponds to one of the predetermined values; (B) establishing a first eye diagram based on the first valid data reception windows corresponding to the predetermined values; and (C) generating a second eye diagram according to the first eye diagram and a tolerance height. In the second eye diagram, each of the predetermined values respectively corresponds to a second valid data reception window, and the second valid data reception window corresponding to said each of the predetermined values in the second eye diagram is smaller than or equal to the first valid data reception window corresponding to said each of the predetermined values in the first eye diagram.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
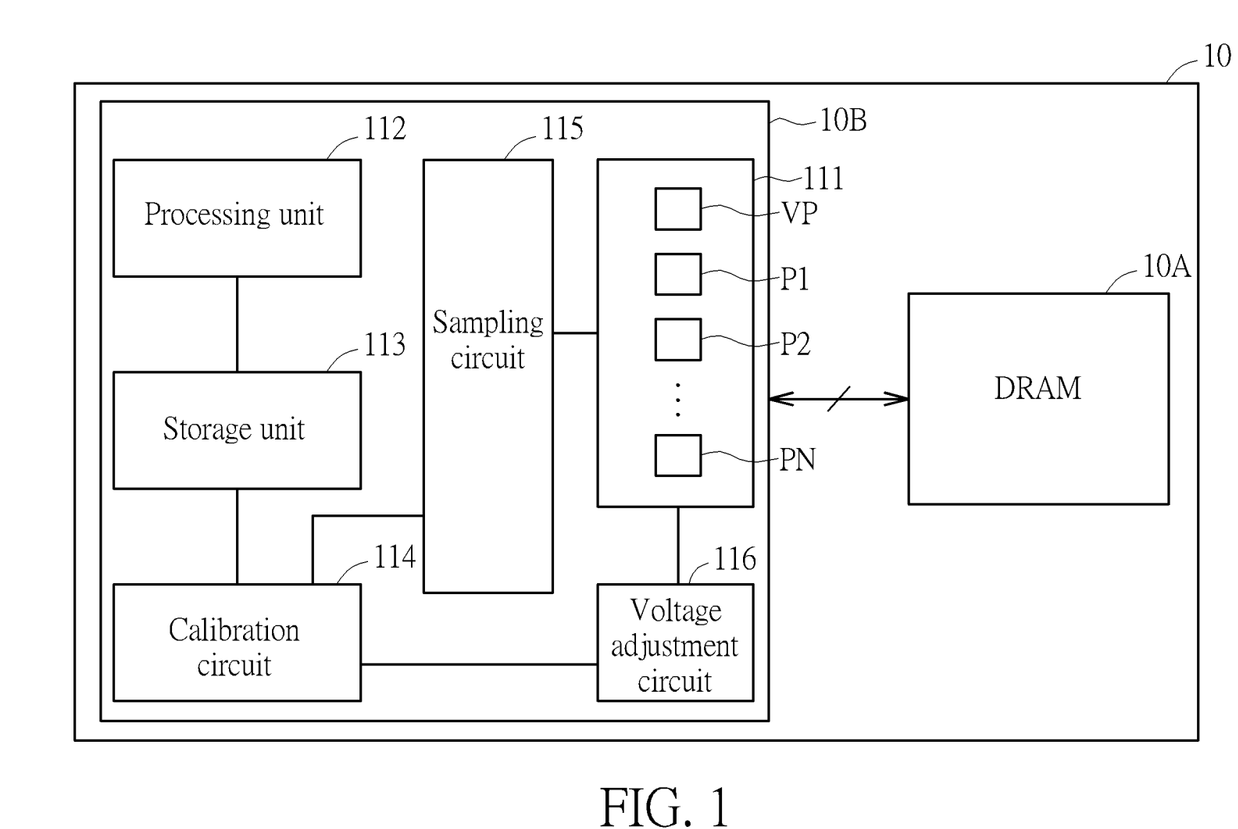
FIG. 1 shows an exemplary block diagram of a dynamic random access memory system.

FIG. 1 shows an exemplary block diagram of a dynamic random access memory (DRAM) system 10. The DRAM system 10 may be applied to personal computers, notebook computers and the like. The DRAM system 10 may comprise a DRAM 10A and a memory controller 10B. The DRAM 10A is a memory device. The memory controller 10B may be configured to control the access operations of the DRAM 10A. During the read operation, the memory controller 10B receives the data DQ and the data strobe signal DQS from the DRAM 10A. To enlarge the valid data reception window at the receiving end and further strengthen the voltage jitter tolerance of the valid data reception window for the received data DQ, a method for calibrating the data reception window and associated hardware devices are proposed.

According to an embodiment of the invention, the memory controller 10B may comprise a receiving (RX) pad module 111, which comprises a plurality of receiving pads, e.g., the RX pads P1-PN, wherein N is a positive integer. The memory controller 10B receives the data DQ from the DRAM 10A through the RX pads P1-PN, wherein the data DQ may be a data signal comprising a plurality of bits (hereinafter referred to as the data signal DQ). As an example, the data signal DQ may comprise bits DQ1-DQN, one of the RX pads P1-PN may be configured to receive one bit of the data signal DQ. In addition, the RX pad module 111 may further comprise a RX pad VP for receiving a reference voltage Vref. In one embodiment of the invention, the RX pads P1-PN share the reference voltage Vref, i.e., the memory controller 10B may only receive one reference voltage Vref through one RX pad VP, and the reference voltage Vref is provided as a commonly used voltage for sampling the data bits DQ1-DQN.

The memory controller 10B may also comprise a processing unit 112, a storage unit 113, a calibration circuit 114, a sampling circuit 115 and a voltage adjustment circuit 116. The processing unit 112 may be a microprocessor or an application-specific integrated circuit (ASIC). The storage unit 113 may be any data storage device for storing program codes and other data required to control the operations of the DRAM system 10. The processing unit 112 may read and execute the program codes stored in the storage unit 113. As an example, the storage unit 113 may be a subscriber identity module (SIM), a read-only memory (ROM), a random-access memory (RAM), an optical disc Read-only memory (CD-ROM), a magnetic tape, a floppy disk, an optical data storage device, etc., but the invention is not limited thereto.

The sampling circuit 115 is configured to sample the data signal DQ according to the reference voltage Vref and the data strobe signal DQS. More specifically, the data strobe signal DQS is utilized to trigger the sampling circuit 115 to sample the bits DQ1-DQN of the data signal, and the data strobe signal DQS will be delayed by different amounts of delay and the sampling operations are repeatedly performed according to the data strobe signal DQS with different delays, so as to obtain a valid data reception window corresponding to each bit. The sampling circuit 115 may repeatedly perform data sampling at different sampling points (or different phases) according to said different delays to calculate or find out a valid data reception window, wherein the valid data reception window defines a time period (or, a range of sampling points or phases) in which the sampling circuit 115 is able to successfully sample the data under a predetermined value set to the reference voltage Vref.

The calibration circuit 114 is configured to control the sampling circuit 115 to sample the data signal DQ by using different setting values of the reference voltage Vref in a calibration procedure, to obtain an eye diagram corresponding to each bit, wherein the eye diagram is a 2D diagram which defines the time periods (or, the ranges of sampling points or phases) and the corresponding range of setting values of the reference voltage in which the sampling circuit 115 is able to successfully sample the data. The calibration circuit 114 may further establish a data eye for the data signal DQ according to an intersection of the eye diagrams corresponding to the bits. The calibration circuit 114 may configure the data eye to the memory controller 10B or the corresponding processing unit 112, for the memory controller 10B to receive the data signal DQ according to the data eye in subsequent operations.

In the calibration procedure, the level of the reference voltage Vref may be set by an external circuit, and provided to the memory controller 10B through the RX pad VP after the setting is completed. Besides changing the setting values of the reference voltage Vref, in the embodiments of the invention, the memory controller 10B may also combine the received reference voltage Vref with different offsets, so as to try to find out preferred voltage offset(s) that makes the corresponding bits DQ1-DQN to have a larger valid data reception window.

More specifically, the voltage adjustment circuit 116 is configured to adjust the reference voltage Vref corresponding to each of the RX pads P1-PN according to different offsets under the control of the calibration circuit 114, wherein the preferred voltage offset for different RX pads P1-PN or for different data bits DQ1-DQN may not be the same. Therefore, the voltage offset corresponding to each of the data bits DQ1-DQN may be independently adjusted by the voltage adjustment circuit 116. It is to be noted that, in the embodiment of the invention, the voltage adjustment circuit 116 does not adjust the setting value of the reference voltage Vref, but, on the basis of the setting value of the reference voltage Vref received from the RX pad VP, locally applies different offsets to the reference voltage Vref to flexibly fine tune the level of the reference voltage Vref. Therefore, in the embodiments of the invention, even if the bits DQ1-DQN share the same reference voltage Vref, locally fine-tuning the level of the reference voltage Vref under each setting value of the reference voltage Vref may provide an opportunity to find out a larger valid data reception window for each bit, thereby enlarging the data eye finally established for the data signal.

It should be noted that although the calibration circuit 114 and the voltage adjustment circuit 116 are shown inside the memory controller 10B, the invention is not limited to disposing the calibration circuit 114 and the voltage adjustment circuit 116 inside the memory controller 10B. In some embodiments, the calibration circuit 114 and the voltage adjustment circuit 116 may also be disposed outside the memory controller 10B.

According to a first embodiment of the invention, under a predetermined setting value (hereinafter referred to as 'predetermined value') of the reference voltage Vref, the calibration circuit 114 may further adjust the level of the reference voltage Vref corresponding to each of the RX pads P1-PN according to one or more voltage offsets through the voltage adjustment circuit 116, and when determining the valid data reception window of one bit under this predetermined value, the results of using this predetermined value in combination with the one or more voltage offsets may be further considered. In one embodiment of the invention, the calibration circuit 114 may set the valid data reception window having the largest width as the valid data reception window of this bit under this predetermined value, and record the corresponding voltage offset (which may be zero or a non-zero value) of the valid data reception window having the largest width.

Figure 2:
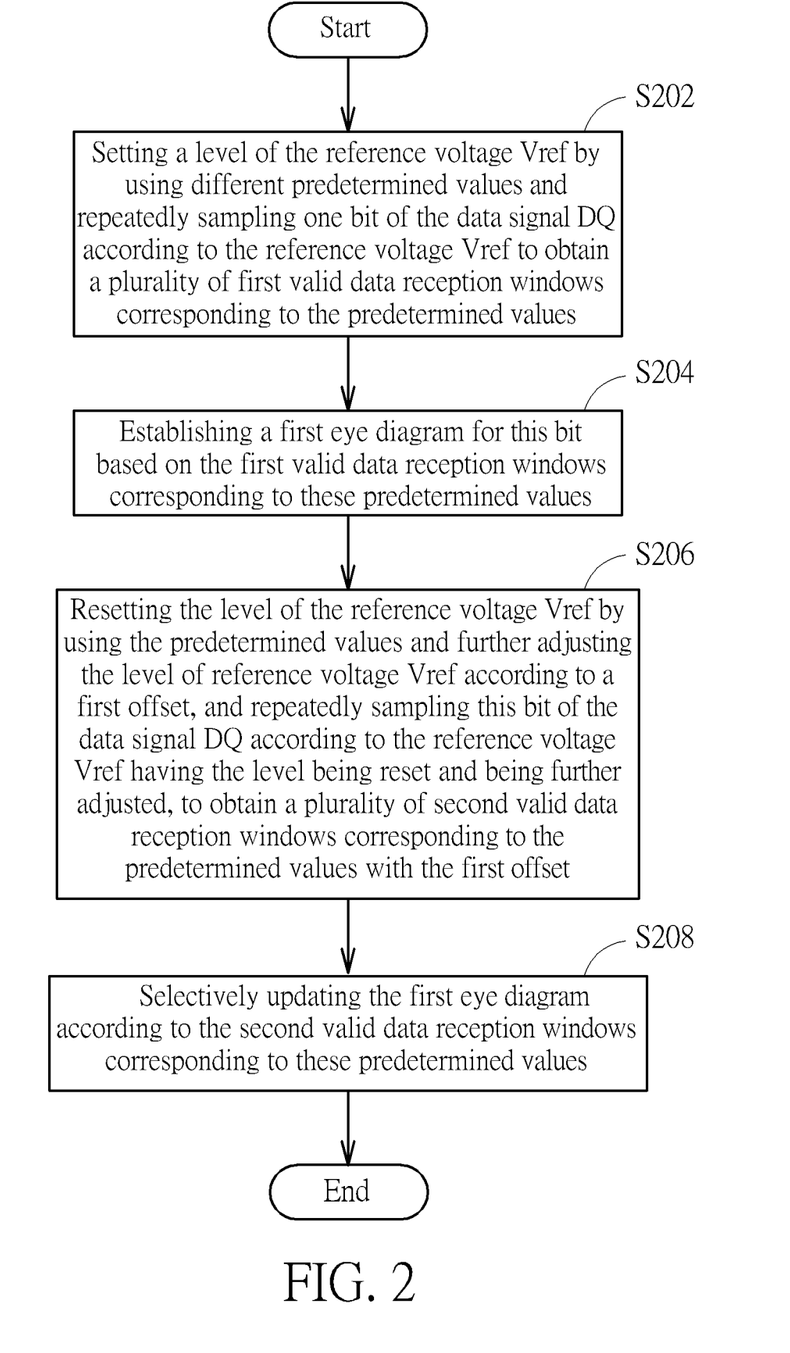
FIG. 2 shows an exemplary flow chart of the method for calibrating the data reception window according to the first embodiment of the invention.

FIG. 2 shows an exemplary flow chart of the method for calibrating the data reception window according to the first embodiment of the invention, which comprises the following steps or operations performed by the calibration circuit 114:

Step/operation S202: setting a level of the reference voltage Vref by using a plurality of different predetermined values (that is, a plurality of predetermined values which are different values) and repeatedly sampling the data signal DQ according to the reference voltage Vref to obtain a plurality of first valid data reception windows corresponding to the predetermined values, wherein one of the first valid data reception windows corresponds to one of the predetermined values. As discussed above, the level or voltage level of the reference voltage Vref may be sequentially set to the different predetermined values by the external circuit, and provided to the memory controller 10B through the RX pad VP after the setting is completed. For each predetermined value set to the reference voltage Vref (which may be regarded as the voltage level of the reference voltage Vref to be tested), the sampling circuit 115 may repeatedly sample one bit of the data signal DQ at different sampling points in response to the data strobe signal DQS with different delays, to determine the first valid data reception window for this bit under the currently set predetermined value.

Step/operation S204: establishing a first eye diagram for this bit based on the first valid data reception windows corresponding to these predetermined values (i.e., the plurality of different predetermined values in step/operation S202).

Step/operation S206: setting (resetting) the level of the reference voltage Vref by using the predetermined values (i.e., the plurality of different predetermined values in step/operation S202) and further adjusting the level of reference voltage Vref according to a first offset through the voltage adjustment circuit 116 to obtain a result substantially equal to or similar to resetting the level of the reference voltage Vref by using the predetermined values combined with the first offset, and then repeatedly sampling the data signal according to the reference voltage having the level being reset by using different predetermined values and being further adjusted by the first offset, to obtain a plurality of second valid data reception windows corresponding to different predetermined values with the first offset. Similarly, for each voltage level of the reference voltage Vref to be tested, the sampling circuit 115 may repeatedly sample one bit of the data signal DQ at different sampling points in response to the data strobe signal DQS with different delays, to determine the second valid data reception window for this bit under the currently set predetermined value.

Step/operation S208: selectively updating the first eye diagram according to the second valid data reception windows corresponding to these predetermined values. To be more specific, for each predetermined value, the calibration circuit 114 may compare the valid data reception windows obtained with no offset and the valid data reception windows obtained with the first offset to determine which one has a larger width (that is, the longer time period/larger range of sampling points or phases in which the sampling circuit 115 is able to successfully sample the data). If the width of the second valid data reception window corresponding to a predetermined value is greater than the width of the first valid data reception window corresponding to the same predetermined value, the calibration circuit 114 may replace the first valid data reception window corresponding to this predetermined values in the first eye diagram with the second valid data reception window, and record the first offset that is able to make the valid data reception window have a larger width for this predetermined value as a better offset corresponding to this predetermined value.

In an embodiment of the invention, the calibration circuit 114 may set the number of offsets to be tested. For example, in one embodiment of the invention, when there is more than one offset to be tested or can be applied, the method in FIG. 2 may further comprise the following steps/operations:

Resetting the level of the reference voltage Vref by using the predetermined values and further adjusting the level of reference voltage Vref according to a second offset through the voltage adjustment circuit 116 to obtain a result substantially equal to or similar to the aforementioned resetting the level of the reference voltage Vref by using the predetermined values combined with the second offset, and then repeatedly sampling the data signal DQ according to the reference voltage Vref having the level being reset by using different predetermined values and being further adjusted by the second offset, to obtain a plurality of third valid data reception windows corresponding to different predetermined values with the second offset. It is to be noted that the above-mentioned steps/operations may also be incorporated into step/operation S206.

In addition, when there is more than one offset to be tested or can be applied, the step/operation S208 may further comprise the following steps/operations:

Selectively updating the first eye diagram according to the valid data reception windows corresponding to these predetermined values (i.e., the plurality of different predetermined values in step/operation S202) combined with different offsets. To be more specific, for each predetermined value, the calibration circuit 114 compares the valid data reception window obtained with no offset and the valid data reception windows obtained with different offsets to determine which one has a larger width. If the width of the valid data reception window obtained by combining the predetermined value with any offset is greater than the width of the first valid data reception window corresponding to the predetermined value without an offset, the calibration circuit 114 may replace the first valid data reception window corresponding to the predetermined value in the first eye diagram by the valid data reception window having the maximum width (or by any valid data reception window having a width larger than that of the first valid data reception window), and record the offset that is able to make the valid data reception window have a larger width for this predetermined value as a better offset corresponding to this predetermined value.

In an embodiment of the invention, the calibration circuit 114 may repeatedly perform steps/operations S202-S208 on different bits of the data signal DQ in the calibration procedure, so as to respectively establish the first eye diagram for each bit. In addition, the calibration circuit 114 may further establish a data eye for the data signal DQ according to an intersection of the first eye diagrams of the bits of the data signal DQ, so that the memory controller 10B is able to apply the data eye in subsequent operations of receiving the data signal DQ.

Figure 3:
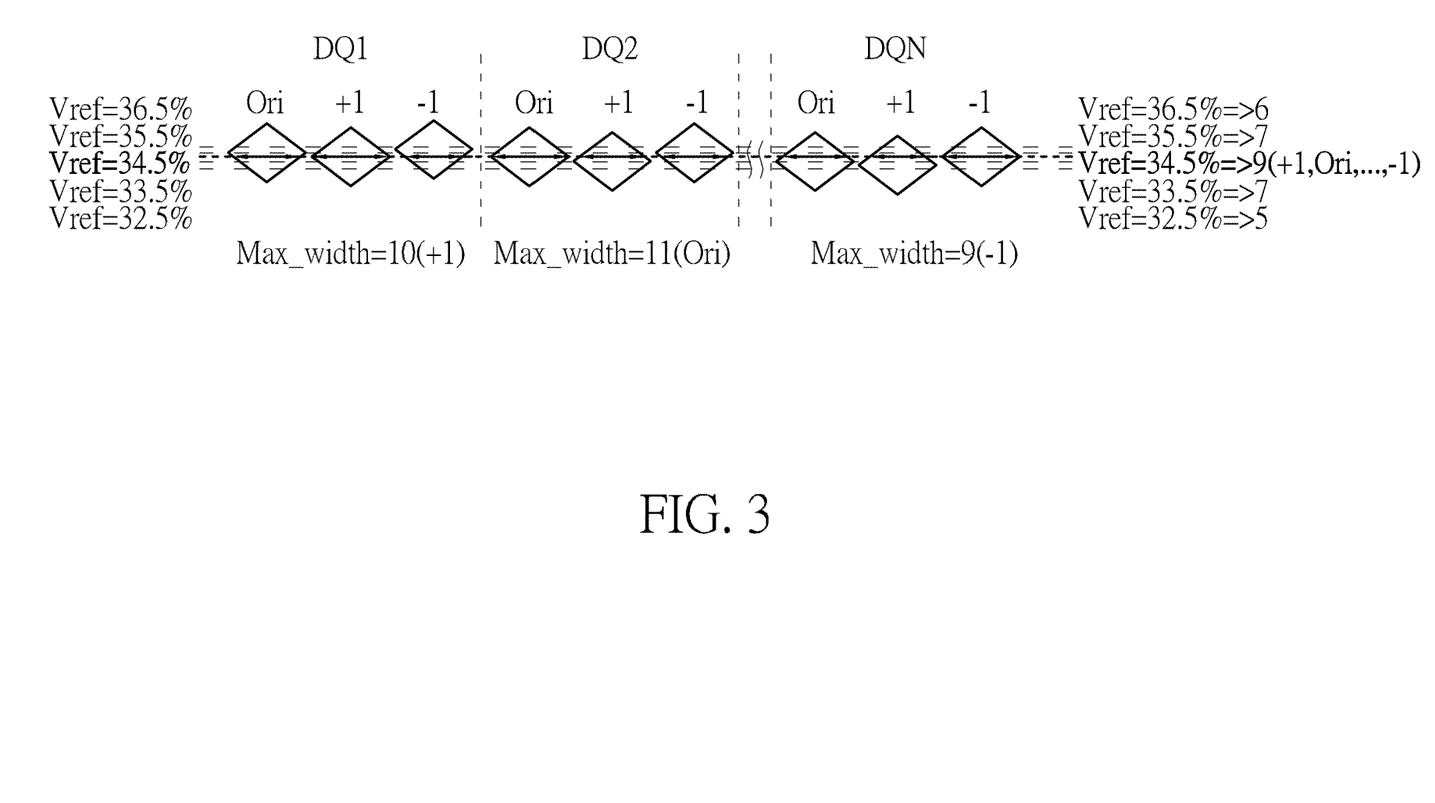
FIG. 3 shows an exemplary eye diagram obtained by combining multiple predetermined values with different offsets.

FIG. 3 shows an exemplary eye diagram obtained by combining multiple predetermined values with different offsets. In FIG. 3, the percentage is utilized to represent the voltage value. Assuming that the maximum swing of the reference voltage Vref is Y, the X % shown in the FIG. 3 and used in the following paragraphs means a voltage value of Y*X %.

In FIG. 3, the eye diagrams for three bits DQ1, DQ2 and DQN are shown. For the ease to compare the differences, the eye diagram drawn on the left with the label 'Ori' is the eye diagram for the reference voltage Vref without applying an offset, the eye diagram drawn in the middle with the label '+1' is the eye diagram obtained when the reference voltage Vref is combined with an +1% offset, and the eye diagram drawn on the right with the label '-1' is the eye diagram obtained when the reference voltage Vref is combined with an −1% offset. Therefore, three labels Ori', '+1' and '-1' are respectively marked on the top of the corresponding eye diagrams for each bit. In addition, the words "Vref=34.5%" marked in bold represents that the level of the reference voltage Vref (that is, the aforementioned predetermined value) is set to Y*34.5%, and the double arrows drawn in each eye diagram respectively represent the valid data reception window obtained when the level of the reference voltage Vref is set to Y*34.5% with no offset, with +1% offset and with −1% offset. In addition, other setting values of the reference voltage Vref, such as the levels Vref=35.5%, Vref=36.5% . . . etc., that have been tested are also shown in FIG. 3, which shows that in the calibration procedure, the calibration circuit 114 may also combine other levels of the reference voltage Vref with different offsets to find out the corresponding valid data reception windows for each bit.

Assuming that the calibration circuit 114 plans to additionally apply two offsets (e.g., +1 and −1) for the testing in the calibration procedure, after obtaining the valid data reception window corresponding to each offset, the calibration circuit 114 compares the width of the valid data reception windows respectively obtained under the conditions of no offset, +1% offset and −1% offset, and take the one having the maximum width. In the example shown in FIG. 3, with the setting of Vref=34.5%, the valid data reception window obtained under the condition of +1% offset for the bit DQ1 has the maximum width of 10, so that there is a mark Max_Width=10(+1) drawn under the eye diagrams of DQ1 in FIG. 3, where 10 represents the number of sampling points or phases in which data is successfully sampled. Similarly, with the same setting of Vref=34.5%, the valid data reception window obtained under the condition of no offset for the bit DQ2 has the maximum width of 11, so that there is a mark Max_Width=11(Ori) drawn under the eye diagrams of DQ2. Likewise, with the same setting of Vref=34.5%, the valid data reception window obtained under the condition of −1% offset for the bit DQN has the maximum width of 9, so that there is a mark Max_Width=9 (−1) drawn under the eye diagrams of DQN.

Then, the calibration circuit 114 further takes the intersection of the valid data reception windows having the maximum width, which are respectively obtained by combining one or more offsets with the reference voltage which is set to Vref=34.5%, of the bits DQ1-DQN, to obtain the data reception window with respect to the setting of Vref=34.5% for the data signal DQ in the data eye. Here, the operation of taking the intersection means that finding out a range that is covered by all the valid data reception windows with the maximum width of the bits DQ1-DQN. Suppose that the data reception window with respect to the setting of Vref=34.5% in the data eye is 9, the calibration circuit 114 records the information regarding the width, the range and the optimal offset for each bit under this setting. An example of the recorded information may be, Vref=34.5%=>9 (+1, Ori . . . −1), as shown on the right side of FIG. 3. The calibration circuit 114 may repeatedly perform the above operations for other settings of the reference voltage Vref combined with different offsets, so as to establish a complete data eye for the data signal DQ. Compared with the data eye established only based on the levels of the reference voltage Vref without applying any offset, the data eye established by the above procedure may have a larger valid data reception window.

According to an embodiment of the invention, to further strengthen the tolerance of the valid data reception window for voltage jitter, the flow shown in FIG. 2 may be continued, and the calibration circuit 114 may further generate a second eye diagram according to the first eye diagram and a tolerance height (or called the eye height) after performing the step/operation S204 and before performing step/operation S208.

In the second eye diagram, each of the predetermined values respectively corresponds to a fourth valid data reception window, and the fourth valid data reception window corresponding to said each of the predetermined values in the second eye diagram is smaller than or equal to the first valid data reception window corresponding to said each of the predetermined values in the first eye diagram.

To be more specific, the calibration circuit 114 may select a predetermined value from the predetermined values and select one or more remaining predetermined values close to the selected predetermined value from the predetermined values according to the tolerance height, and determine the fourth valid data reception window corresponding to the selected predetermined value in the second eye diagram according to an intersection of the first valid data reception window corresponding to the selected predetermined value and the first valid data reception windows corresponding to said one or more remaining predetermined values close to the selected predetermined value. In addition, according to an embodiment of the invention, after generating the second eye diagram, the calibration circuit 114 may further replace the first eye diagram by the second eye diagram, and continue to perform the step/operation S208. It is to be noted that in the embodiments of applying the tolerance height, when applying voltage offsets, such as the step/operation S206, the calibration circuit 114 may also generate another eye diagram in a similar way according to both the tolerance height and the applied offsets, so as to gain the benefit of better tolerance to voltage jitter.

Figure 4:
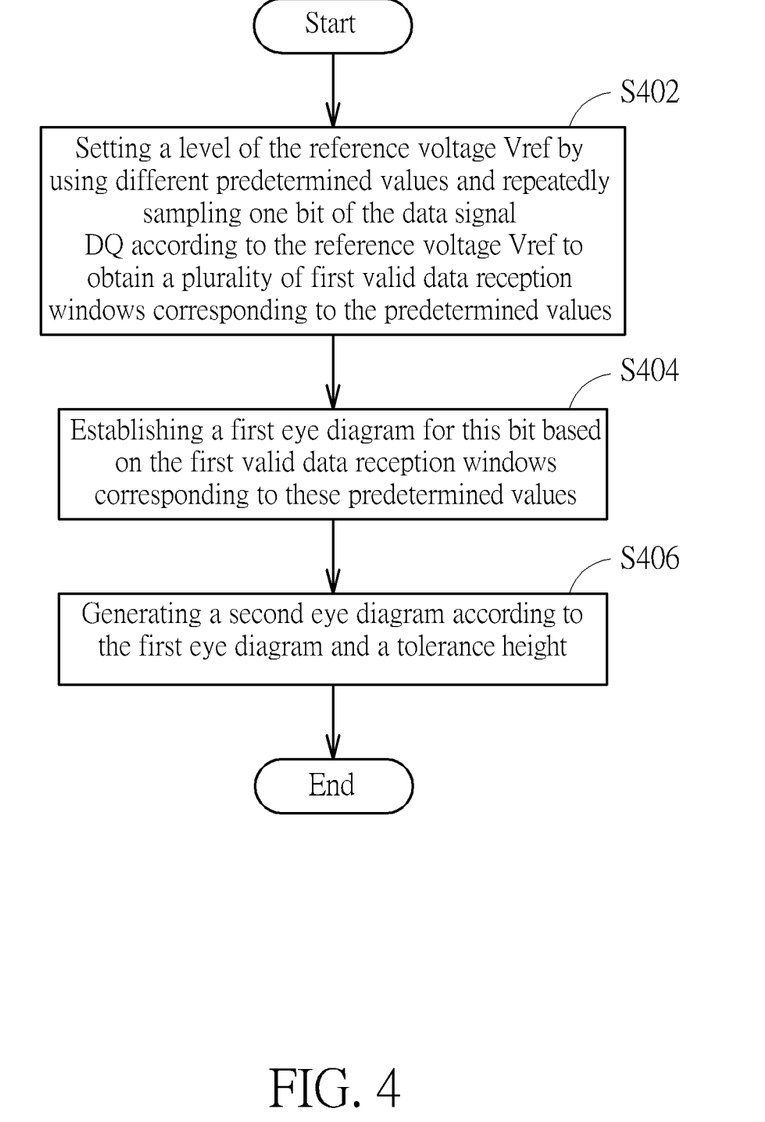
FIG. 4 shows an exemplary flow chart of the method for calibrating the data reception window according to the second embodiment of the invention.

FIG. 4 shows an exemplary flow chart of the method for calibrating the data reception window according to the second embodiment of the invention, which comprises the following steps or operations performed by the calibration circuit 114:

Step/operation S402: setting a level of the reference voltage Vref by using a plurality of different predetermined values (that is, a plurality of predetermined values which are different values) and repeatedly sampling the data signal DQ according to the reference voltage Vref to obtain a plurality of first valid data reception windows corresponding to the predetermined values, wherein one of the first valid data reception windows corresponds to one of the predetermined values. As discussed above, the level or voltage level of the reference voltage Vref may be sequentially set to the different predetermined values by the external circuit, and provided to the memory controller 10B through the RX pad VP after the setting is completed. For each predetermined value set to the reference voltage Vref (which may be regarded as the voltage level of the reference voltage Vref to be tested), the sampling circuit 115 may repeatedly sample one bit of the data signal DQ at different sampling points in response to the data strobe signal DQS with different delays, to determine the first valid data reception window for this bit under the currently set predetermined value.

Step/operation S404: establishing a first eye diagram for this bit based on the first valid data reception windows corresponding to these predetermined values.

Step/operation S406: generating a second eye diagram according to the first eye diagram and a tolerance height. In the second eye diagram, each of the predetermined values respectively corresponds to a second valid data reception window, and the second valid data reception window corresponding to said each of the predetermined values in the second eye diagram is smaller than or equal to the first valid data reception window corresponding to said each of the predetermined values in the first eye diagram.

In the embodiments of the invention, the calibration circuit 114 may repeatedly perform the steps/operations S402-S406 on different bits of the data signal DQ in the calibration procedure, so as to respectively establish the second eye diagram for each bit. In addition, the calibration circuit 114 may further establish a data eye for the data signal DQ according to an intersection of the second eye diagrams of the bits of the data signal DQ, so that the memory controller 10B is able to apply the data eye in subsequent operations of receiving the data signal DQ.

Figure 5A:
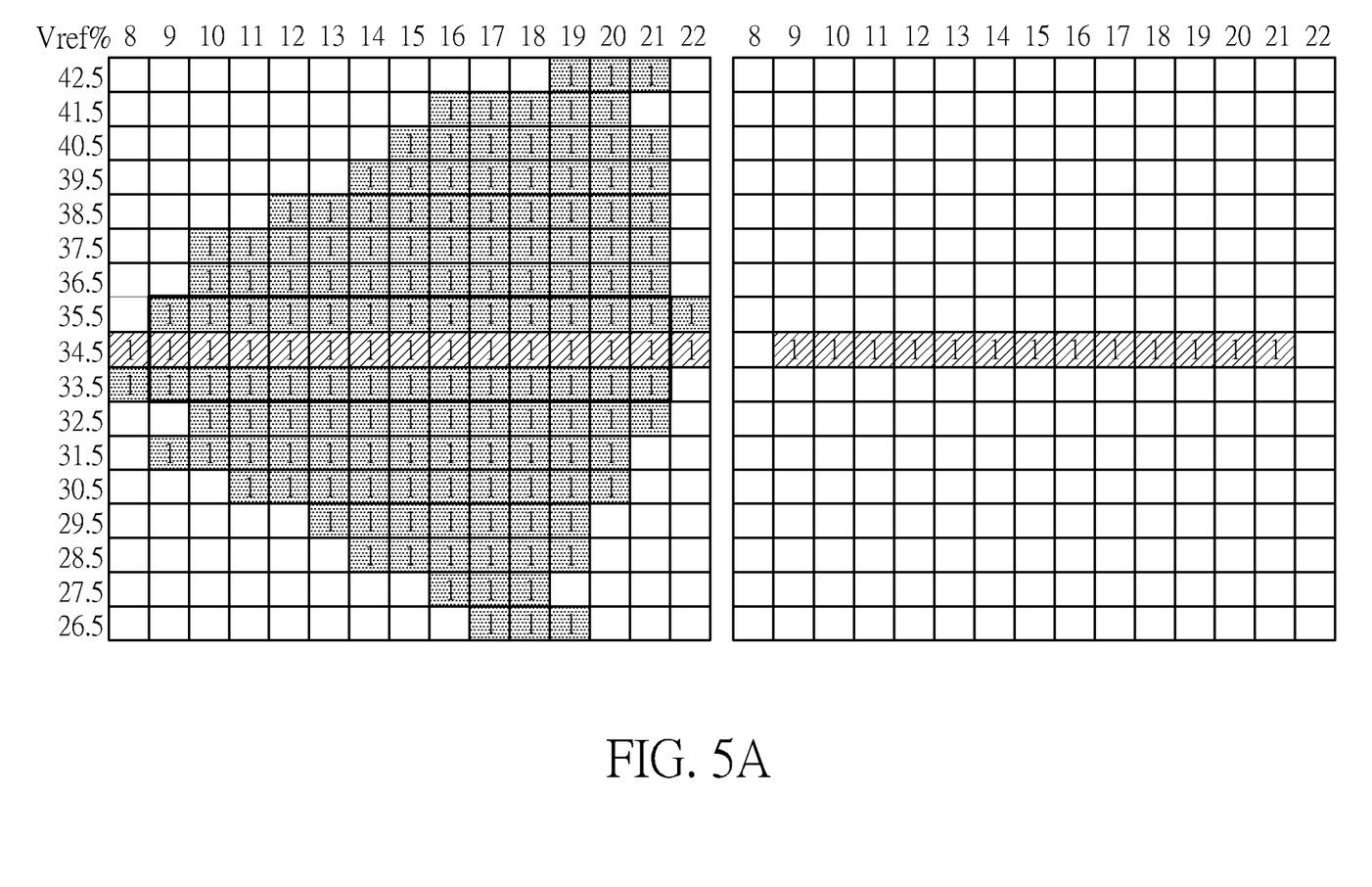
FIG. 5A-FIG. 5C sequentially show the process of generating the second eye diagram according to the first eye diagram for one bit and the set tolerance height according to an embodiment of the invention.
Figure 5B:
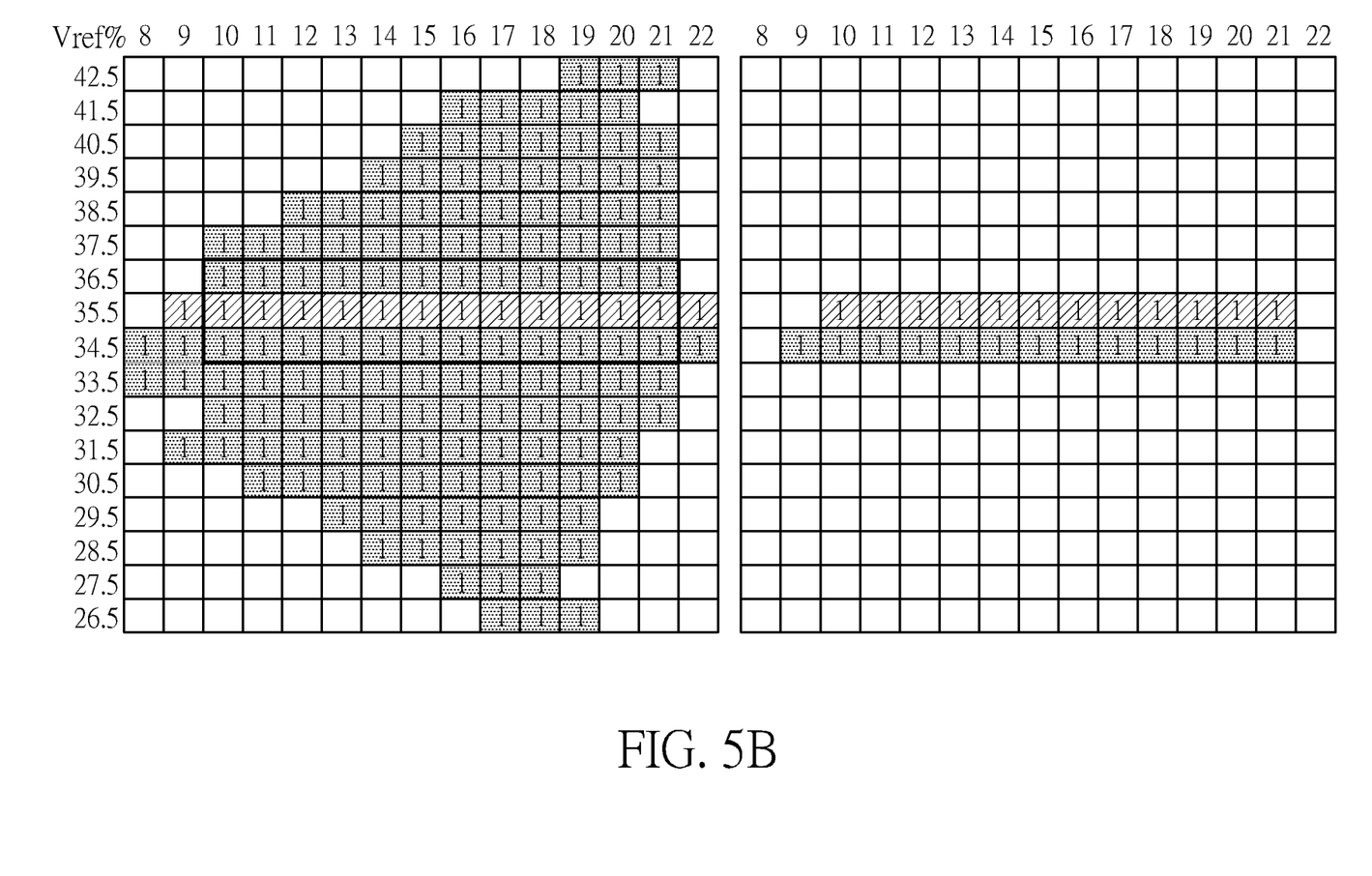
Figure 5C:
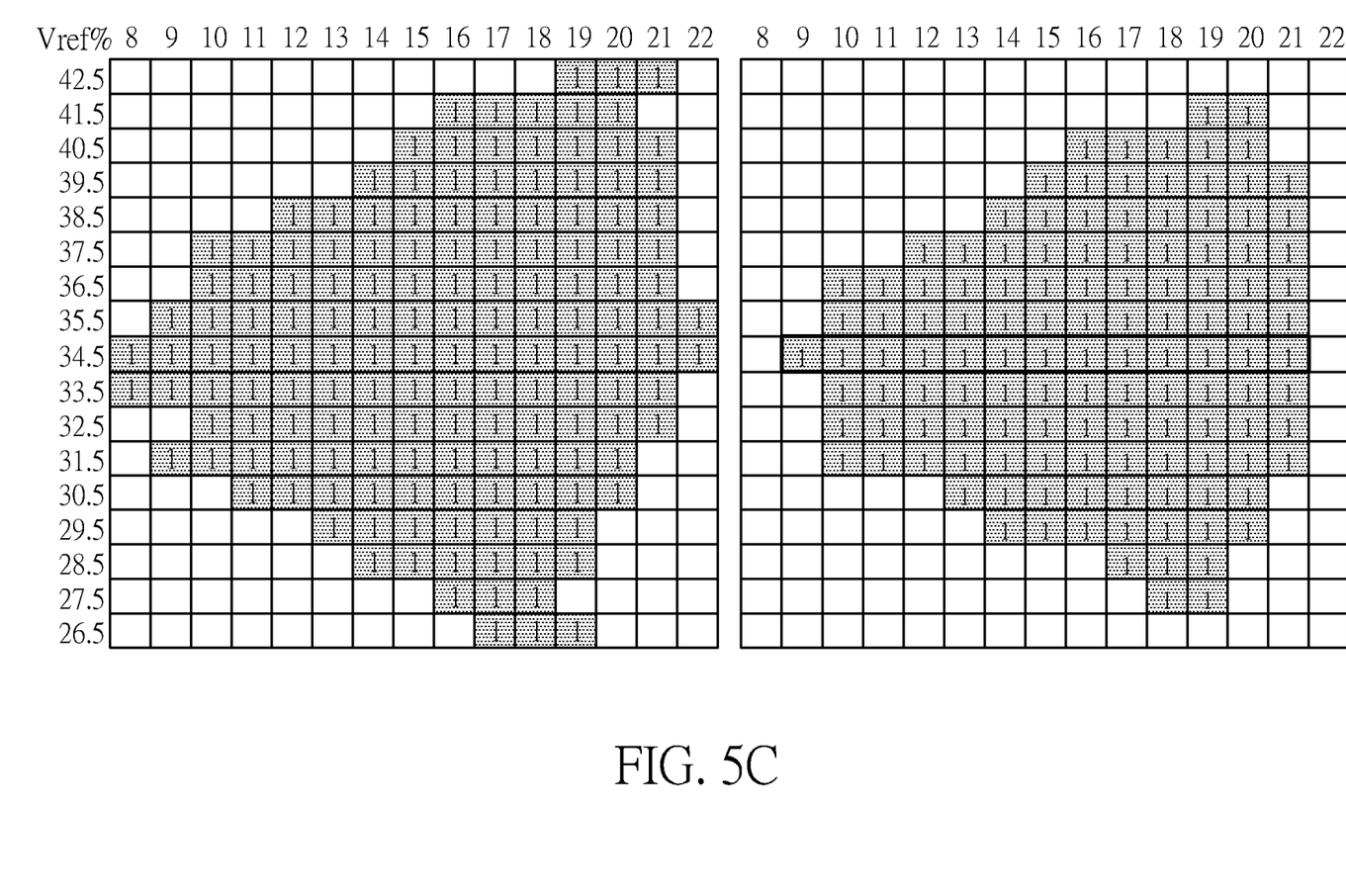

FIG. 5A-FIG. 5C sequentially show the process of generating the second eye diagram for one bit (e.g., DQ1) according to the first eye diagram and the set tolerance height. In the left side of FIG. 5A-FIG. 5C, the first eye diagram corresponding to the bit DQ1 is shown, wherein the vertical axis represents each predetermined value for setting the reference voltage Vref in percentage, the numbers on the horizontal axis represent the index values of sampling points or phases, and the lattice filled with the digit '1' in the figure indicates that the data content of bit DQ1 is successfully or correctly sampled at the corresponding sampling point or phase by using the corresponding predetermined value.

Assuming that the currently set tolerance height is 3 and the voltage resolution is 1%, it means that for a given (or, selected) predetermined value (for example, Vref=34.5% in FIG. 5A), the calibration circuit 114 may further select two predetermined values close to the selected predetermined value (for example, the other two predetermined values Vref=35.5% and Vref=33.5%), and determine the valid data reception window corresponding to the selected predetermined value in the second eye diagram (for example, the valid data reception window corresponding to the predetermined value 34.5% shown on the right side of FIG. 5A) according to an intersection of the data reception windows corresponding to these three predetermined values (for example, the sampling points or phase that can be covered by all the three data receiving windows that are framed by the box drawn on the left side of FIG. 5A).

The calibration circuit 114 sequentially may selects different predetermined values to perform the above operations, for example, selects the predetermined value Vref=35.5% as shown in FIG. 5B and perform the above operations, so as to obtain the valid data reception window for different predetermined values after considering the tolerance height, and use the valid data reception windows to establish a second eye diagram, such as the eye diagram shown on the right side of FIG. 5C. Compared with the first eye diagram on the left side of FIG. 5C, the second eye diagram shown on the right side of FIG. 5C may have better voltage jitter tolerance. For example, under the setting of the reference voltage Vref=34.5%, even if there is a voltage jitter of 1%, the correct data content can still be obtained when the bit DQ1 is sampled within the range of sampling points or phases 9-21.

According to an embodiment of the invention, in order to further enlarge the valid data reception window, continuing the flow shown in FIG. 4, the calibration circuit 114 may further perform the following steps or operations (not shown in FIG. 4):

Step/operation S408: resetting the level of the reference voltage by using the predetermined values as in step/operation S402 combined with at least one offset and repeatedly sampling the data signal according to the reference voltage having the level being reset and being further adjusted to obtain a plurality of third valid data reception windows corresponding to the predetermined values with an offset, wherein one of the third valid data reception windows corresponds to one of the predetermined values.

Step/operation S410: generating a third eye diagram according to the third valid data reception windows corresponding to these predetermined values.

Step/operation S412: selectively updating the second eye diagram according to the tolerance height and the third eye diagram.

Wherein the step/operation S412 may further comprise the following steps or operations (not shown in FIG. 4):

Step/operation S412-1: selecting a predetermined value from the predetermined values and selecting one or more remaining predetermined values close to the selected predetermined value from the predetermined values according to the tolerance height.

Step/operation S412-2: determining a fourth valid data reception window corresponding to the selected predetermined value according to an intersection of the third valid data reception window corresponding to the selected predetermined value and the third valid data reception windows corresponding to said one or more remaining predetermined values close to the selected predetermined value.

Step/operation S412-3: comparing a width of the fourth valid data reception window and a width of the second valid data reception window corresponding to the selected predetermined value in the second eye diagram, and replacing the second valid data reception window corresponding to the selected predetermined value in the second eye diagram by the fourth valid data reception window when the width of the fourth valid data reception window is larger than the width of the second valid data reception window.

According to an embodiment of the invention, when there is more than one offset to be tested or can be applied, the calibration circuit 114 may repeatedly perform steps/operations S408-S412 by using different offsets to obtain the third eye diagrams corresponding to different offsets, and selectively update the second eye diagram according to the tolerance height and the third eye diagrams.

Figure 6:
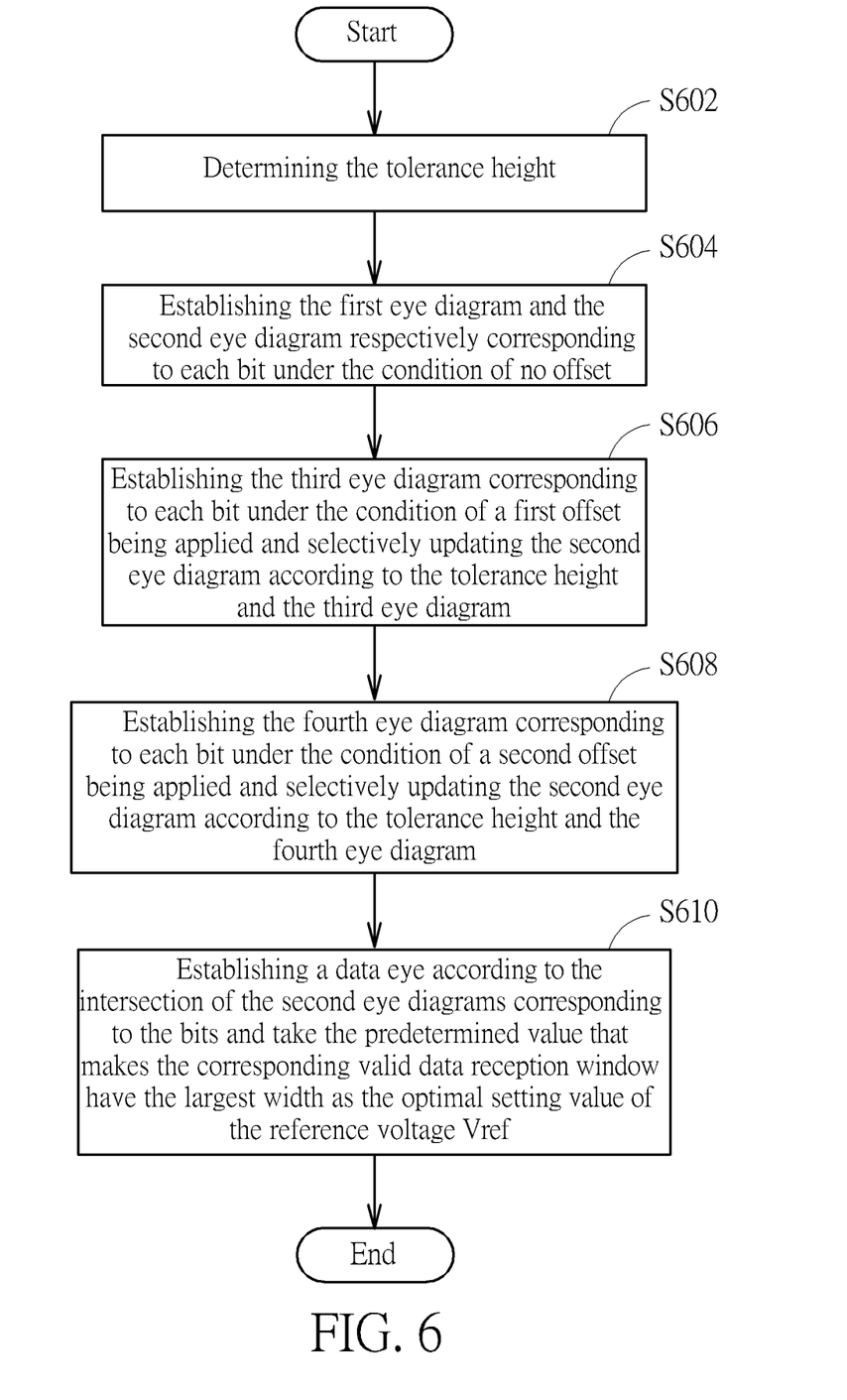
FIG. 6 shows an exemplary flow chart of the method for calibrating the data reception window according to the third embodiment of the invention.

FIG. 6 shows an exemplary flow chart of the method for calibrating the data reception window according to the third embodiment of the invention, which comprises the following steps or operations performed by the calibration circuit 114:

Step/operation S602: determining the tolerance height (or call the eye height).

Step/operation S604: establishing the first eye diagram and the second eye diagram respectively corresponding to each bit under the condition of no offset (for example, when the voltage adjustment circuit 116 is disabled), wherein the step/operation S604 may further comprise the following step/operation:

Step/operation S604-1: setting the level of the reference voltage Vref to a predetermined value and sampling each bit of the data signal DQ according to the reference voltage Vref to obtain a valid data reception window corresponding to this predetermined value for each bit.

Step/operation S604-2: re-performing the step/operation S604-1 by using different predetermined value to obtain the valid data reception windows of each bit corresponding to different predetermined values, and establishing corresponding first eye diagram for each bit.

Step/operation S604-3: generating a second eye diagram corresponding to each bit according to a tolerance height and the first eye diagram thereof as the aforementioned step/operation S406.

Step/operation S606: establishing the third eye diagram corresponding to each bit under the condition of a first offset being applied (for example, when the voltage adjustment circuit 116 is enabled and setting the first offset as, for example, offset=+1%), and selectively updating the second eye diagram for the bit according to the tolerance height and the third eye diagram thereof, wherein the step/operation S606 may further comprise the following step/operation:

Step/operation S606-1: setting the level of the reference voltage Vref to a predetermined value and sampling each bit of the data signal DQ according to the reference voltage Vref to obtain a valid data reception window corresponding to this predetermined value. It is to be noted that in step S606-1, the voltage adjustment circuit 116 may further adjust the level of the reference voltage Vref according to the currently set first offset to obtain a result substantially equal to or similar to resetting the level of the reference voltage Vref by using the predetermined values combined with the first offset, and sampling the data signal DQ according to the reference voltage having the level being reset and being further adjusted by the first offset.

Step/operation S606-2: re-performing the step/operation S606-1 by using different predetermined values to obtain the valid data reception windows with respect to different predetermined values for each bit under the condition when the first offset is applied, and establishing the third eye diagram for each bit.

Step/operation S606-3: As in the above step/operation S412, selectively updating the second eye diagram according to the tolerance height and the third eye diagram. It is to be noted that in S606, if the valid data reception window corresponding to any predetermined value in the second eye diagram is updated, the calibration circuit 114 further records the corresponding first offset for the predetermined value(s).

Step/operation S608: establishing the fourth eye diagram corresponding to each bit under the condition of a second offset being applied (for example, when the voltage adjustment circuit 116 is enabled and setting the first offset as, for example, offset=−1%), and selectively updating the second eye diagram for the bit according to the tolerance height and the fourth eye diagram thereof. The detailed operations of step/operation S608 are similar to S606-1-S606-3 of S606, and will not be repeated here for brevity.

In FIG. 6, the number of offsets to be tested is set to 2 for illustration. If the number of offset to be tested is set to 1, the calibration circuit 114 may not perform the step/operation S608. If the number of offsets to be tested is set to a number greater than or equal to 3, the calibration circuit 114 may further perform one or more steps/operations similar to S606/S608 before performing the final step/operation S610.

Step/operation S610: establishing a data eye for the data signal DQ according to the intersection of the second eye diagrams corresponding to the bits of the data signal DQ, and take the predetermined value that makes the corresponding valid data reception window have the largest width as the optimal setting value of the reference voltage Vref.

Figure 7:
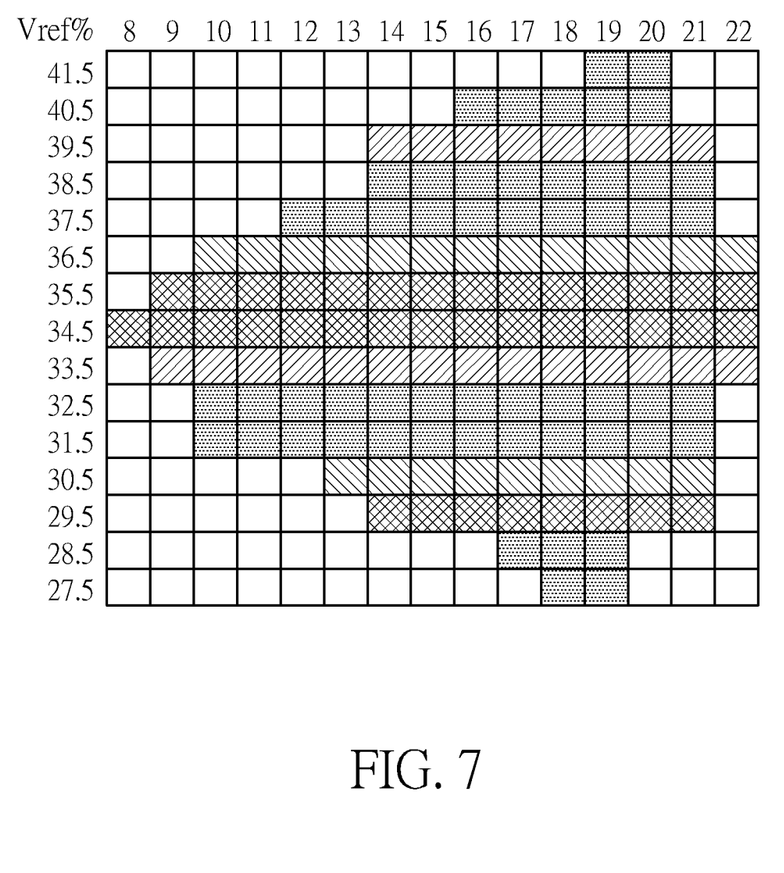
FIG. 7 shows an exemplary eye diagram for one bit after applying two or more different offsets.

FIG. 7 shows an exemplary eye diagram obtained after step/operation S608 is completed (for example, after applying two or more different offsets). In the second eye diagram, the valid data receiving windows corresponding to different offsets are drawn by different meshes. Since the second eye diagram is the result of being selectively updated according to different offsets and with the consideration of the tolerance height, the updated second eye diagram may comprise the valid data reception windows corresponding to one or more different offsets. Please note that the digit '1' used to indicate a successfully or correctly sampled result is removed from FIG. 7 to facilitate the distinction of different meshes.

Figure 8:
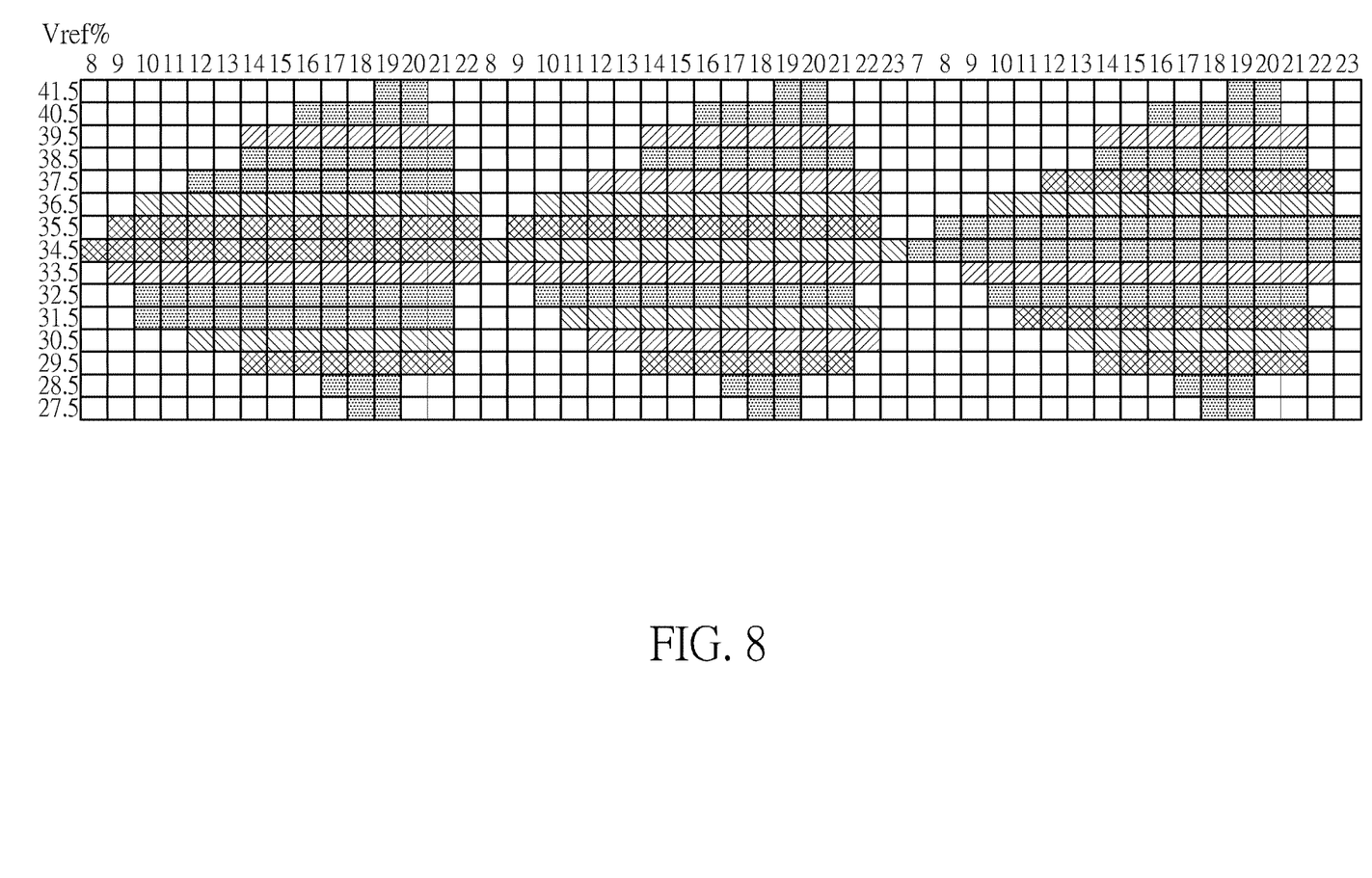
FIG. 8 shows exemplary second eye diagrams of a plurality of bits obtained by applying at least three different offsets.

FIG. 8 shows exemplary second eye diagrams of a plurality of bits obtained by applying at least three different offsets, and it may also be an example of the final eye diagram for the bits. The eye diagram on the left side is the final eye diagram corresponding to bit DQ1, the eye diagram in the middle is the final eye diagram corresponding to bit DQ2, the eye diagram on the right side is the final eye diagram corresponding to bit DQN, and different meshes are utilized to represent different offsets. Similarly, to facilitate the distinction of different meshes, the digit '1' used to indicate the successfully or correctly sampled result is removed from FIG. 8

In an embodiment of the invention, the calibration circuit 114 may take the intersection of these eye diagrams as the data eye of the data signal DQ, and take a predetermined value that makes the valid data reception window to have the maximum width, for example, 34.5% in this example, as the optimal setting value for the reference voltage Vref setting value. Under the setting of the reference voltage Vref=34.5%, the preferred offset corresponding to the bits DQ1, DQ2 and DQN may be different, for example, may respectively be −1%, +1% and 0.

In the embodiments of the invention, by applying the proposed method and the associated devices for calibrating data reception window, the valid data reception window of the receiving end is effectively enlarged, and the tolerance of the valid data reception window to voltage jitter is enhanced as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller, coupled to a memory device to control access operations of the memory device, wherein the memory controller receives a data signal from the memory device through a plurality of receiving pads, and the memory controller comprises:
    a sampling circuit, configured to sample the data signal according to a reference voltage; and
    a calibration circuit, configured to perform operations comprising:
        (A) setting a level of the reference voltage by using a plurality of predetermined values which are different values and controlling the sampling circuit to repeatedly sample the data signal according to the reference voltage to obtain a plurality of first valid data reception windows corresponding to the predetermined values, wherein one of the first valid data reception windows corresponds to one of the predetermined values;
        (B) establishing a first eye diagram based on the first valid data reception windows corresponding to the predetermined values;
        (C) resetting the level of the reference voltage by using the predetermined values combined with a first offset and controlling the sampling circuit to repeatedly sample the data signal according to the reference voltage to obtain a plurality of second valid data reception windows corresponding to the predetermined values, wherein one of the second valid data reception windows corresponds to one of the predetermined values; and
        (D) selectively updating the first eye diagram according to the second valid data reception windows corresponding to the predetermined values,
    wherein when a width of one of the second valid data reception windows corresponding to one of the predetermined values is greater than a width of the first valid data reception window corresponding to said one of the predetermined values, the first valid data reception window corresponding to said one of the predetermined values in the first eye diagram is replaced by the second valid data reception window corresponding to said one of the predetermined values, and
    wherein the calibration circuit is further configured to perform following operation:
        (F) generating a second eye diagram according to the first eye diagram and a tolerance height,
    wherein in the second eye diagram, each of the predetermined values respectively corresponds to a third valid data reception window, and the third valid data reception window corresponding to said each of the predetermined values in the second eye diagram is smaller than or equal to the first valid data reception window corresponding to said each of the predetermined values in the first eye diagram.

2. The memory controller of claim 1, wherein before the operation (D), the operations performed by the calibration circuit further comprises:
    (E) resetting the level of the reference voltage by using the predetermined values combined with a second offset and controlling the sampling circuit to repeatedly sample the data signal according to the reference voltage to obtain a plurality of fourth valid data reception windows corresponding to the predetermined values, wherein one of the fourth valid data reception windows corresponds to one of the predetermined values,
    wherein when the calibration circuit performs the operation (D), the calibration circuit selectively updates the first eye diagram further according to fourth valid data reception windows corresponding to the predetermined values, and
    wherein when a width of one of the second valid data reception windows corresponding to said one of the predetermined values or a width of one of the fourth valid data reception windows corresponding to said one of the predetermined values is greater than a width of the first valid data reception window corresponding to said one of the predetermined values, the first valid data reception window corresponding to said one of the predetermined values in the first eye diagram is replaced by one of the second valid data reception window and the fourth valid data reception window having the larger width.

3. The memory controller of claim 1, wherein operation (F) further comprises:
  (F-1) selecting a predetermined value from the predetermined values and selecting one or more remaining predetermined values close to the selected predetermined value from the predetermined values according to the tolerance height; and
  (F-2) determining the third valid data reception window corresponding to the selected predetermined value in the second eye diagram according to an intersection of the first valid data reception window corresponding to the selected predetermined value and the first valid data reception windows corresponding to said one or more remaining predetermined values close to the selected predetermined value.

4. The memory controller of claim 1, wherein the calibration circuit performs the operation (F) after performing the operation (B) and before performing the operation (D), and the operation (F) further comprises replacing the first eye diagram by the second eye diagram after generating the second eye diagram.

5. The memory controller of claim 1, wherein the data signal comprises a plurality of bits, each of the receiving pads is configured to receive one bit of the data signal, the sampling circuit is configured to repeatedly sample the bits according to the reference voltage and the calibration circuit is configured to repeatedly perform operations (A)-(D) on the bits in a calibration procedure to respectively establish the first eye diagram for each bit.

6. The memory controller of claim 5, wherein the calibration circuit is further configured to establish a data eye for the data signal according to an intersection of the first eye diagrams of the bits.

7. A method for calibrating data reception window, comprising:
  (A) setting a level of a reference voltage by using a plurality of predetermined values which are different values and repeatedly sampling a data signal received from a memory device according to the reference voltage to obtain a plurality of first valid data reception windows corresponding to the predetermined values, wherein one of the first valid data reception windows corresponds to one of the predetermined values;
  (B) establishing a first eye diagram based on the first valid data reception windows corresponding to the predetermined values;
  (C) resetting the level of the reference voltage by using the predetermined values combined with a first offset and repeatedly sampling the data signal according to the reference voltage to obtain a plurality of second valid data reception windows corresponding to the predetermined values, wherein one of the second valid data reception windows corresponds to one of the predetermined values;
  (D) selectively updating the first eye diagram according to the second valid data reception windows corresponding to the predetermined values; and
  (F) generating a second eye diagram according to the first eye diagram and a tolerance height,
  wherein when a width of one of the second valid data reception windows corresponding to one of the predetermined values is greater than a width of the first valid data reception window corresponding to said one of the predetermined values, the first valid data reception window corresponding to said one of the predetermined values in the first eye diagram is replaced by the second valid data reception window corresponding to said one of the predetermined values, and
  wherein in the second eye diagram, each of the predetermined values respectively corresponds to a third valid data reception window, and the third valid data reception window corresponding to said each of the predetermined values in the second eye diagram is smaller than or equal to the first valid data reception window corresponding to said each of the predetermined values in the first eye diagram.

8. The method of claim 7, further comprising:
  (E) resetting the level of the reference voltage by using the predetermined values combined with a second offset and repeatedly sampling the data signal according to the reference voltage to obtain a plurality of fourth valid data reception windows corresponding to the predetermined values, wherein one of the fourth valid data reception windows corresponds to one of the predetermined values,
  wherein in operation (D), the first eye diagram is selectively updated further according to the fourth valid data reception windows corresponding to the predetermined values, and
  wherein when a width of one of the second valid data reception windows corresponding to said one of the predetermined values or a width of one of the fourth valid data reception windows corresponding to said one of the predetermined values is greater than a width of the first valid data reception window corresponding to said one of the predetermined values, the first valid data reception window corresponding to said one of the predetermined values in the first eye diagram is replaced by one of the second valid data reception window and the fourth valid data reception window having the larger width.

9. The method of claim in claim 7, wherein operation (F) further comprises:
  (F-1) selecting a predetermined value from the predetermined values and selecting one or more remaining predetermined values close to the selected predetermined value from the predetermined values according to the tolerance height; and
  (F-2) determining the third valid data reception window corresponding to the selected predetermined value in the second eye diagram according to an intersection of the first valid data reception window corresponding to the selected predetermined value and the first valid data reception windows corresponding to said one or more remaining predetermined values close to the selected predetermined value.

10. The method of claim in claim 7, wherein performance of operation (F) is arranged between performances of operation (B) and operation (D), and the operation (F) further comprises operation of replacing the first eye diagram by the second eye diagram after generating the second eye diagram.

11. The method of claim in claim 7, wherein the data signal comprises a plurality of bits, and the method further comprises:
  (G) repeatedly performing operations (A)-(D) on the bits in a calibration procedure to respectively establish the first eye diagram for each bit.

12. The method of claim in claim 7, further comprising:
  (H) establishing a data eye for the data signal according to an intersection of the first eye diagrams of the bits.

13. A method for calibrating data reception window, comprising:

(A) setting a level of a reference voltage by using a plurality of predetermined values which are different values and repeatedly sampling a data signal received from a memory device according to the reference voltage to obtain a plurality of first valid data reception windows corresponding to the predetermined values, wherein one of the first valid data reception windows corresponds to one of the predetermined values;

(B) establishing a first eye diagram based on the first valid data reception windows corresponding to the predetermined values; and (C) generating a second eye diagram according to the first eye diagram and a tolerance height, wherein in the second eye diagram, each of the predetermined values respectively corresponds to a second valid data reception window, and the second valid data reception window corresponding to said each of the predetermined values in the second eye diagram is smaller than or equal to the first valid data reception window corresponding to said each of the predetermined values in the first eye diagram.

14. The method of claim in claim 13, wherein operation (C) further comprises:

(C-1) selecting a predetermined value from the predetermined values and selecting one or more remaining predetermined values close to the selected predetermined value from the predetermined values according to the tolerance height; and (C-2) determining the second valid data reception window corresponding to the selected predetermined value in the second eye diagram according to an intersection of the first valid data reception window corresponding to the selected predetermined value and the first valid data reception windows corresponding to said one or more remaining predetermined values close to the selected predetermined value.

15. The method of claim 13, further comprising:

(D) resetting the level of the reference voltage by using the predetermined values combined with a first offset and repeatedly sampling the data signal according to the reference voltage to obtain a plurality of third valid data reception windows corresponding to the predetermined values, wherein one of the third valid data reception windows corresponds to one of the predetermined values; and (E) generating a third eye diagram according to the third valid data reception windows; and (F) selectively updating the second eye diagram according to the tolerance height and the third eye diagram.

16. The method of claim in claim 13, wherein operation (F) further comprises:

(F-1) selecting a predetermined value from the predetermined values and selecting one or more remaining predetermined values close to the selected predetermined value from the predetermined values according to the tolerance height;

(F-2) determining a fourth valid data reception window corresponding to the selected predetermined value according to an intersection of the third valid data reception window corresponding to the selected predetermined value and the third valid data reception windows corresponding to said one or more remaining predetermined values close to the selected predetermined value; and (F-3) comparing a width of the fourth valid data reception window and a width of the second valid data reception window corresponding to the selected predetermined value in the second eye diagram, and replacing the second valid data reception window corresponding to the selected predetermined value in the second eye diagram by the fourth valid data reception window when the width of the fourth valid data reception window is larger than the width of the second valid data reception window.

17. The method of claim 13, wherein the data signal comprises a plurality of bits, and the method further comprises:

(G) repeatedly performing operations (A)-(C) on the bits in a calibration procedure to respectively establish the second eye diagram for each bit.

18. The method of claim 17, further comprising:

(H) establishing a data eye for the data signal according to an intersection of the second eye diagrams of the bits.

* * * * *